(12) United States Patent
Ha (10) Patent No.: US 7,737,477 B2
(45) Date of Patent: Jun. 15, 2010

(54) CMOS IMAGE SENSOR AND METHOD FOR MANUFACTURING THE SAME

(75) Inventor: Hyeon Woo Ha, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/232,752

(22) Filed: Sep. 23, 2008

(65) Prior Publication Data

US 2009/0026512 A1 Jan. 29, 2009

Related U.S. Application Data

(62) Division of application No. 11/320,469, filed on Dec. 29, 2005, now Pat. No. 7,442,994.

(30) Foreign Application Priority Data

| Dec. 30, 2004 | (KR) | ............... 10-2004-0116482 |
| Dec. 9, 2005 | (KR) | ............... 10-2005-0120283 |

(51) Int. Cl.
*H01L 27/146* (2006.01)
(52) U.S. Cl. ............... 257/290; 257/292; 257/294; 257/447; 257/E27.133; 257/E27.144; 257/E31.121; 257/E31.122
(58) Field of Classification Search ............... 257/292, 257/294, E27.133, E27.134, 447, E31.121, 257/E31.122, 290
See application file for complete search history.

(56) References Cited

U.S. PATENT DOCUMENTS 5,880,495 A * 3/1999 Chen ............... 257/233
6,040,593 A 3/2000 Park
6,051,857 A 4/2000 Miida
6,100,551 A 8/2000 Lee et al.
6,358,759 B1 3/2002 Hirabayashi
6,462,806 B2 * 10/2002 Zhang et al. ............... 349/199
6,541,329 B1 4/2003 Chen et al.
7,180,092 B2 2/2007 Yamazaki et al.
2003/0025160 A1 * 2/2003 Suzuki et al. ............... 257/347
2004/0188792 A1 9/2004 Bissot et al.
2004/0251477 A1 12/2004 Pourquier et al.
2005/0233493 A1 * 10/2005 Augusto ............... 438/51

FOREIGN PATENT DOCUMENTS

| GB | 2115980 A | 9/1983 |
| WO | WO 2004054001 A2 | 6/2004 |

* cited by examiner

*Primary Examiner*—Eugene Lee
*Assistant Examiner*—Peniel M Gumedzoe
(74) *Attorney, Agent, or Firm*—McKenna Long & Aldridge LLP (57) ABSTRACT

A CMOS image sensor and a method for manufacturing the same improve light-receiving efficiency and maintain a margin in the design of a metal line. The CMOS image sensor includes a transparent substrate including an active area having a photodiode region and a transistor region and a field area for isolation of the active area, a p-type semiconductor layer on the transparent substrate, a photodiode in the p-type semiconductor layer corresponding to the photodiode region, and a plurality of transistors in the p-type semiconductor layer corresponding to the transistor region.

11 Claims, 9 Drawing Sheets

CMOS IMAGE SENSOR AND METHOD FOR MANUFACTURING THE SAME

This application is a divisional of application Ser. No. 11/320,469, filed Dec. 29, 2005, now U.S. Pat. No. 7,442,994 and claims the benefit of Korean Patent Application No. 10-2004-0116482 filed on Dec. 30, 2004, and Korean Patent Application No. 10-2005-0120283 filed on Dec. 9, 2005, each of which are hereby incorporated by reference for all purposes as if fully set forth herein.

BACKGROUND OF THE INVENTION

1. Field of the Invention

The present invention relates to a CMOS image sensor, and a method for manufacturing the same, that improves the light-receiving efficiency of a photodiode.

2. Discussion of the Related Art

An image sensor is a semiconductor device that converts an optical image to an electric signal. Image sensors can be broadly categorized into charge coupled devices (CCD) and complementary metal oxide semiconductor (CMOS) image sensors.

In a CCD, respective metal-oxide-silicon MOS capacitors are positioned adjacently, wherein electric charge carriers are stored in and transferred to the capacitors. However, a CMOS image sensor adopts CMOS technology, which uses a control circuit and a signal processing circuit as the peripheral circuit. The CMOS image sensor uses a switching method of sequentially detecting output signals by forming a predetermined number of MOS transistors to correspond to the number of pixels.

A CMOS image sensor has advantages of low power consumption, low production cost and high integration. CMOS image sensors have received a great amount of attention as substitutes for CCDs because of the development of this recent technology.

A CMOS image sensor may be classified into 3T-type, 4T-type, or 5T-type, according to a number of transistors in the CMOS image sensor. The 3T-type CMOS image sensor is comprised of one photodiode and three transistors, and the 4T-type CMOS image sensor is comprised of one photodiode and four transistors.

An equivalent circuit and a layout for the 3T-type CMOS image sensor according to the related art will be described as follows.

Figure 1:
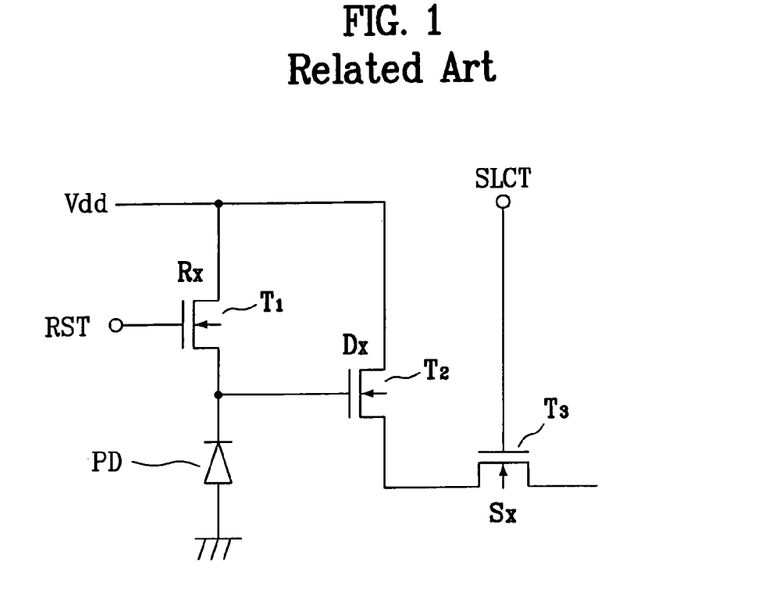
FIG. 1 is an equivalent circuit diagram of a 3T-type CMOS image sensor according to the related art.
Figure 2:
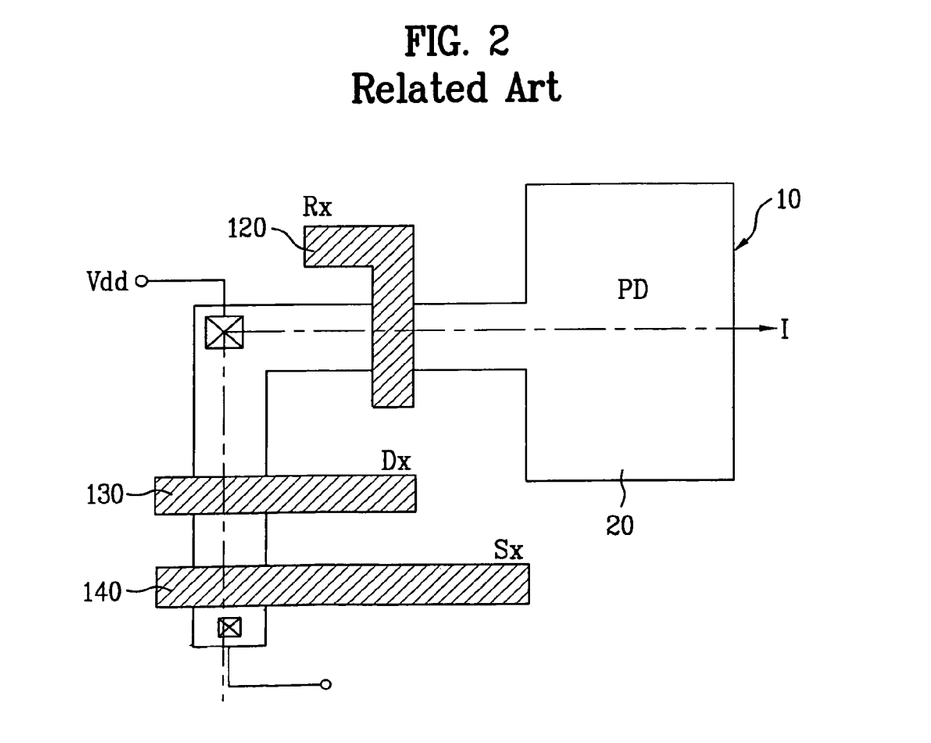
FIG. 2 is a layout of a unit pixel of a 3T-type CMOS image sensor according to the related art.
Figure 3:
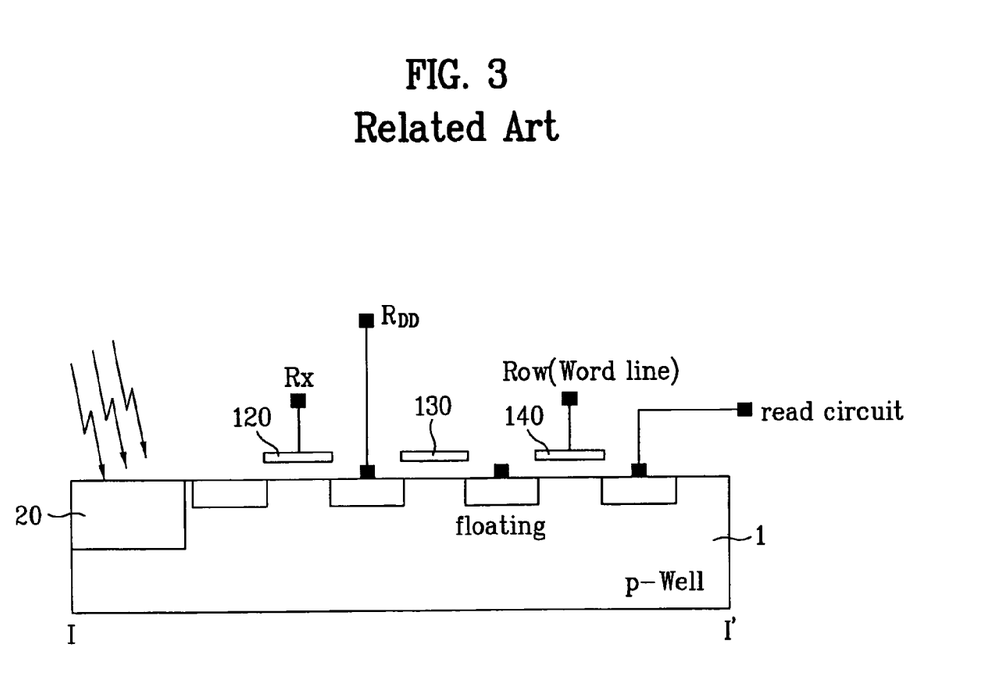
FIG. 3 is a cross sectional view taken along line I-I' of FIG. 2.

FIG. 1 is an equivalent circuit diagram of a 3T-type CMOS image sensor according to the related art. FIG. 2 is a layout of one pixel in the 3T-type CMOS image sensor according to the related art. FIG. 3 is a cross sectional view along I-I' of FIG. 2.

As shown in FIG. 1, a unit pixel of the 3T-type CMOS image sensor according to the related art comprises one photodiode PD and three NMOS transistors T1, T2 and T3. A cathode of the photodiode PD is connected with a drain of the first nMOS transistor T1 and a gate of the second NMOS transistor T2.

Also, sources of the first and second nMOS transistors T1 and T2 are connected with a power supplying line for receiving a reference voltage RDD. A gate of the first nMOS transistor T1 is connected with a reset line for receiving a reset signal RST.

A source of the third NMOS transistor T3 is connected with a drain of the second NMOS transistor, and a drain of the third nMOS transistor T3 is connected with a read circuit through a signal line. Further, a gate of the third nMOS transistor T3 is connected with a word line for receiving a selection signal SLCT.

The first nMOS transistor T1 functions as a reset transistor Rx. Also, the second nMOS transistor T2 is a drive transistor Dx, and the third nMOS transistor T3 is a select transistor Sx.

In the unit pixel of the 3T-type CMOS image sensor, as shown in FIGS. 2 and 3, an active area 10 and a field area are defined in a p-type semiconductor substrate 1. Then, one photodiode 20 is formed in a large sized portion of the active area 10. Also, respective gate electrodes 120, 130 and 140 of three transistors are overlapped with the remaining portion of the active area 10.

N-type impurity ions may be more deeply implanted into the photodiode 20 than the remaining portions of the active area.

The reset transistor Rx is formed by the gate electrode 120, the drive transistor Dx is formed by the gate electrode 130, and the select transistor Sx is formed by the gate electrode 140. Impurity ions may be implanted into the active area 10 of the respective transistors excluding portions below the gate electrodes 120, 130 and 140, thereby forming source and drain regions in the respective transistors.

Accordingly, a power voltage Vdd is applied to the source and drain regions between the reset transistor Rx and the drive transistor Dx. Also, the source and drain regions provided at one side of the select transistor Sx are connected with the read circuit.

Although not shown, the respective, gate electrodes 120, 130 and 140 are connected with signal lines. Each one end of the signal lines has a pad being connected with an external driving circuit.

The three photodiodes constitute one pixel. That is, one pixel is made by forming red, green and blue color filter layers on the respective three photodiodes.

Figure 4:
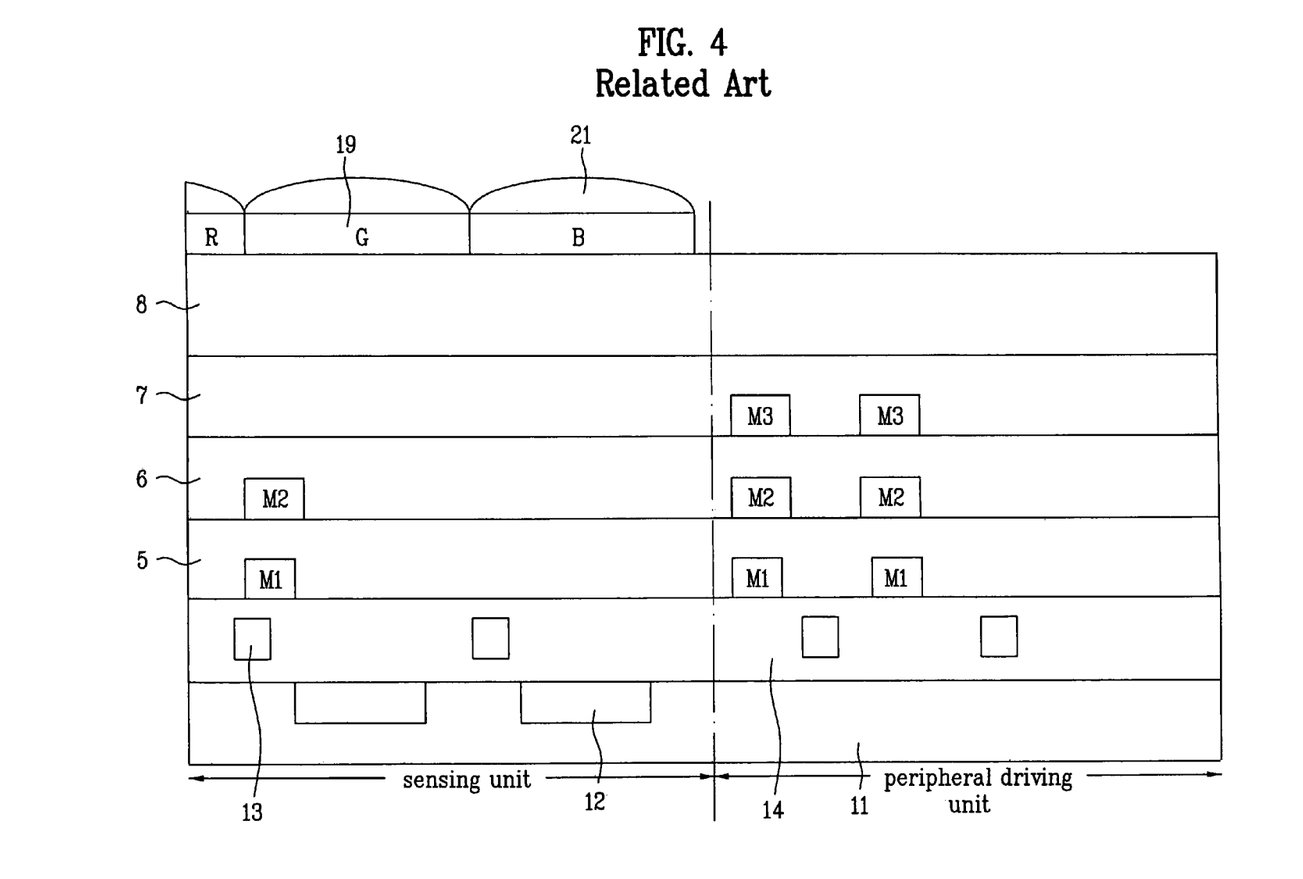
FIG. 4 is a cross sectional view of a CMOS image sensor according to the related art.

FIG. 4 is a cross sectional view of a CMOS image sensor according to the related art. As shown in FIG. 4, a related art CMOS image sensor is defined with a sensing unit and a peripheral driving unit. On a semiconductor substrate 11, a field oxide layer (not shown) is formed to define an active area, and then a plurality of photodiodes PD 12 and transistors 13 are formed in the semiconductor substrate 11 of the active area. Then, a first insulating interlayer 14 is formed on a surface of the semiconductor substrate 11 including the photodiodes 12 and transistors 13. The first insulating layer 14 may have a thickness of about 7450 Å.

Then, a plurality of metal lines M1, M2 and M3 for one unit pixel are formed on the first insulating interlayer 14, wherein the plurality of metal lines M1, M2 and M3 are positioned not to shield the incident light. Second to fourth insulating interlayers 15, 16 and 17 for insulation of the respective metal lines M1, M2 and M3 and a planarization layer 18 are formed. The first metal line M1 may be formed at a thickness of about 5070 Å on the first insulating interlayer 14. Then, the second insulating interlayer 15 is formed on the surface of the semiconductor substrate 11 including the first metal line M1. The second insulating layer 15 may be formed at a thickness of about 7300 Å.

Then, the second metal line M2 may be formed at a thickness of about 5070 Å on the second insulating interlayer 15, and the third insulating interlayer 16 may be formed at a thickness of about 7300 Å on the surface of the semiconductor substrate 11 including the second metal line M2. Also, the third metal line M3 may be formed at a thickness of about 9630 Å on the third insulating interlayer 16, and the fourth insulating interlayer 17 may be formed at a thickness of about 4000 Å on the surface of the semiconductor substrate 11 including the third metal line M3. Then, the planarization layer 18, which may have a thickness of about 3000 Å, is formed on the fourth insulating interlayer 17.

To realize a color image, an RGB color filter layer 19 is formed on the planarization layer 18 of the sensing unit, and a micro-lens 21 is formed on the RGB color filter layer 19. To form the micro-lens 21, after coating a photoresist, the photoresist is patterned to be left over the photodiode 12, and is reflowed by baking so as to obtain a desired curvature. The micro-lens 21 concentrates the incident light into the photodiode 12.

Figure 5A:
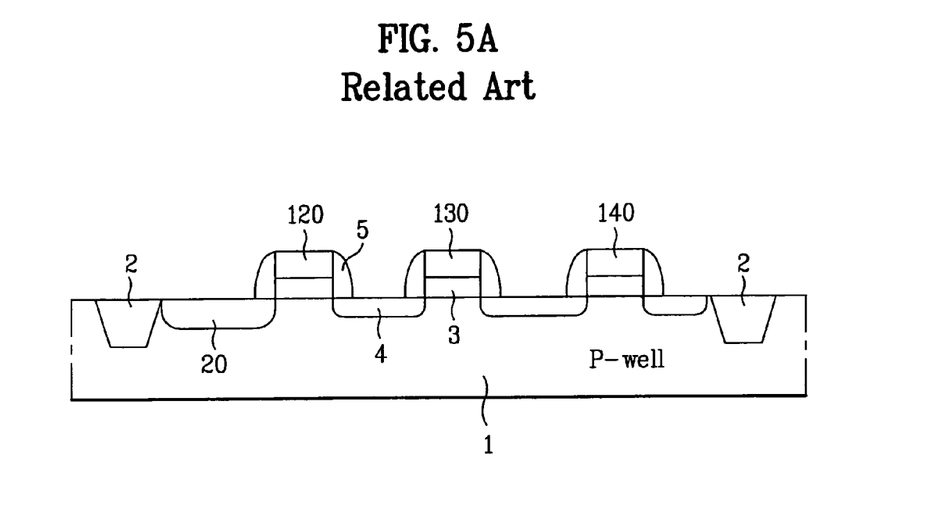
FIGS. 5A and 5B are cross sectional views of a CMOS image sensor fabricated by a method according to the related art.
Figure 5B:
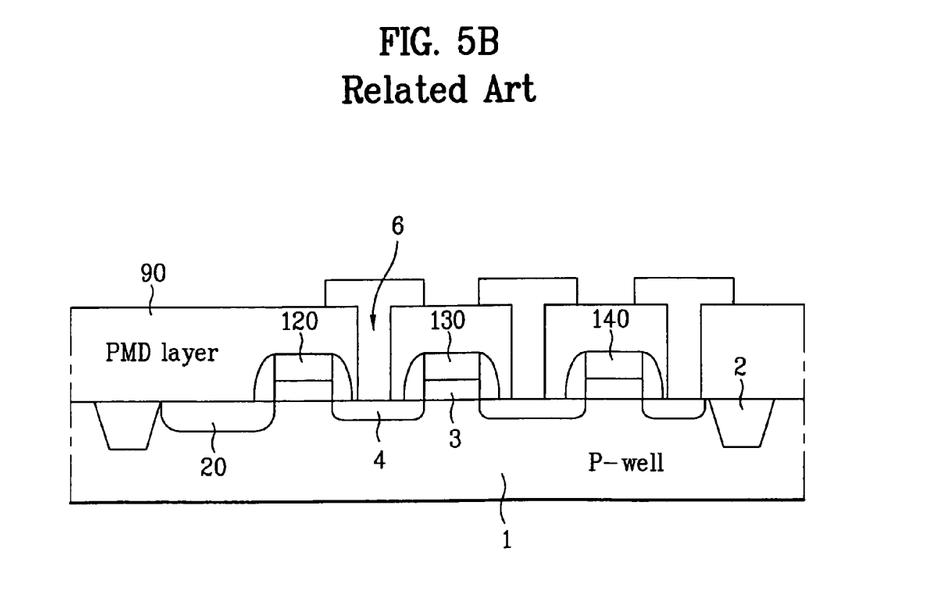

FIGS. 5A and 5B are cross sectional views of a CMOS image sensor fabricated by a method according to the related art.

As shown in FIG. 5A, a p-well is formed by implanting p-type impurity ions to a semiconductor substrate 1. After defining an active area and a field area in the semiconductor substrate 1, an STI (Shallow Trench Isolation) 2 is formed in the field area.

Then, a gate oxide layer 3 and a conductive layer are formed on a surface of the semiconductor substrate 1, and are then selectively removed to form gate electrodes 120, 130 and 140 of transistors. Subsequently, n-type impurity ions are implanted into a photodiode region of the active area, thereby forming a photodiode 20. Then, n-type impurity ions are implanted into the active area excluding the photodiode region, to form source and drain regions 4 for each of the transistors.

To form the source and drain regions 4, N-type impurity ions are implanted at a low density using the gate electrodes 120, 130 and 140 as a mask, thereby forming an LDD (Lightly Doped Drain) region. After forming insulating sidewalls 5 at sides of the respective gate electrodes 120, 130 and 140, n-type impurity ions may be implanted at a high density, thereby forming the source and drain regions 4 for the transistors.

As shown in FIG. 5B, a PMD (Pre-Metal Dielectric) 90 made of, for example, TEOS oxide, may be formed on the surface of the semiconductor substrate 1 including the gate electrodes 120, 130 and 140 by LPCVD, whereby a first insulating interlayer 14 may be formed at a thickness of about 1000 Å.

Then, a contact hole 6 for exposing the source and drain regions 4 is formed by selectively etching the first insulating interlayer 14. Then, a metal layer is deposited and selectively etched to form a first metal line M1. The contact hole 6 may be formed by a plasma etching process.

In the same method explained in FIG. 4, respective insulating interlayers 15, 16 and 17 and metal lines M2 and M3 are formed, and a planarization layer 18 is formed on the fourth insulating interlayer 17. Thereafter, an RGB color filter layer 19, for realizing a color image, is formed on the planarization layer 18, and a micro-lens 21 is formed on the color filter layer 19.

However, the CMOS image sensor and the method for manufacturing the same according to the related art have the following disadvantages.

First, the photodiode region is positioned at a lower side of the semiconductor substrate, and the insulating layers and metal lines are formed over the photodiode region. As a result, the size of the light-receiving area for the photodiode is restricted. Also, it is impossible to form the metal line over the photodiode. Accordingly, the design of the metal line is restricted.

Due to the thickness of the metal line and the insulating interlayer, the light-receiving efficiency of the photodiode is lowered. Thus, it is necessary to form an additional micro-lens.

SUMMARY OF THE INVENTION

Accordingly, the present invention is directed to a CMOS image sensor and a method for manufacturing the same that substantially obviate one or more problems due to limitations and disadvantages of the related art.

An advantage of the present invention is to provide a CMOS image sensor, and a method for manufacturing the same, that improves light-receiving efficiency.

Another advantage of the present invention is to provide a CMOS image sensor, and a method for manufacturing the same, that maintains a margin in the design of a metal line.

Additional features and advantages of the invention will be set forth in the description which follows, and will be apparent from the description, or may be learned by practice of the invention. The objectives and other advantages of the invention may be realized and attained by the structure and method particularly pointed out in the written description and claims hereof as well as the appended drawings.

To achieve these and other advantages and in accordance with the purpose of the invention, as embodied and broadly described, a CMOS image sensor includes a transparent substrate including an active area, having a photodiode region and a transistor region, the transparent substrate further including a field area for isolation of the active area; a p-type semiconductor layer on the transparent substrate; a photodiode in the p-type semiconductor layer corresponding to the photodiode region; and a plurality of transistors in the p-type semiconductor layer corresponding to the transistor region.

In another aspect of the present invention, a method for manufacturing a CMOS image sensor includes preparing a transparent substrate including an active area, having a photodiode region and a transistor region, and a field area for isolation of the active area; forming a black matrix layer on the transparent substrate excluding the photodiode region; forming a color filter layer on the transparent substrate corresponding to the photodiode region; forming a p-type semiconductor layer on the transparent substrate of the active area including the color filter layer and the black matrix layer; forming a gate insulating layer and a plurality of gate electrodes on the p-type semiconductor layer of the transistor region; forming a photodiode including an n-type impurity region and a p-type impurity region in the p-type semiconductor layer of the photodiode region; and forming a source region and a drain region by implanting n-type impurity ions into the p-type semiconductor layer between each of the plurality of gate electrodes.

In another aspect of the present invention, a method for manufacturing a CMOS image sensor includes preparing a transparent substrate including an active area, having a photodiode region and a transistor region, and a field area for isolation of the active area; forming a p-type semiconductor layer on the transparent substrate of the active area; forming a gate insulating layer and a plurality of gate electrodes on the p-type semiconductor layer of the transistor region; forming a photodiode including an n-type impurity region and a p-type impurity region in the p-type semiconductor layer of the photodiode region; and forming a source region and a drain region by implanting n-type impurity ions into the p-type semiconductor layer between each of the plurality of gate electrodes.

In another aspect of the present invention, a method for manufacturing a CMOS image sensor includes preparing a transparent substrate including an active area, having a photodiode region and a transistor region, and a field area for isolation of the active area; forming a black matrix layer on the transparent substrate excluding the photodiode region; forming a p-type semiconductor layer on the transparent substrate of the active area including the black matrix layer; forming a gate insulating layer and a plurality of gate electrodes on the p-type semiconductor layer of the transistor region; forming a photodiode including an n-type impurity region and a p-type impurity region in the p-type semiconductor layer of the photodiode region; and forming a source region and a drain region by implanting n-type impurity ions into the p-type semiconductor layer between each of the plurality of gate electrodes.

In another aspect of the present invention, a method for manufacturing a CMOS image sensor includes preparing a transparent substrate including an active area, having a photodiode region and a transistor region, and a field area for isolation of the active area; forming a color filter layer on the rear surface of the transparent substrate corresponding to the photodiode region; forming a p-type semiconductor layer on the transparent substrate of the active area including the color filter layer; forming a gate insulating layer and a plurality of gate electrodes on the p-type semiconductor layer of the transistor region; forming a photodiode including an n-type impurity region and a p-type impurity region in the p-type semiconductor layer of the photodiode region; and forming a source region and a drain region by implanting n-type impurity ions into the p-type semiconductor layer between each of the plurality of gate electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or similar parts.

A CMOS image sensor and a method for manufacturing the same according to the present invention will be described with reference to the accompanying drawings.

Figure 6:
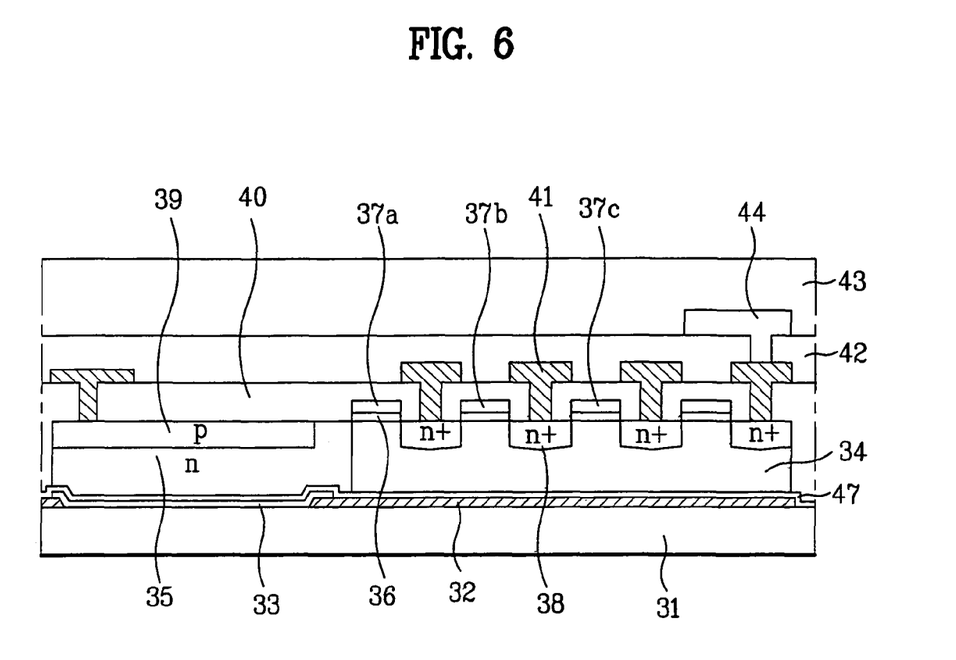
FIG. 6 is a cross sectional view of a CMOS image sensor according to an exemplary embodiment of the present invention.

FIG. 6 is a cross sectional view of a CMOS image sensor according to an exemplary embodiment of the present invention. The CMOS image sensor includes an active area and a field area, wherein the active area includes a photodiode region and a transistor region.

As shown in FIG. 6, a black matrix layer 32 is formed on a transparent substrate, such as a glass substrate or a quartz substrate, 31 corresponding to the field area and the active area excluding the photodiode region. The black matrix layer 32 may be formed of a metal material such as chrome Cr or a black resin to shield the light.

To realize a color image, an RGB color filter layer 33 is formed on the transparent substrate 31 corresponding to the photodiode region. Then, an insulating layer 47, which may be silicon oxide or silicon nitride, is formed on a surface of the transparent substrate 31 including the RGB color filter layer 33 and the black matrix layer 32. Alternatively, the insulating layer 47 may not be formed.

Then, a p-type semiconductor layer 34 is formed on the insulating layer 47 of the active region. The p-type semiconductor layer 34 is formed not in the field region but in the active region, whereby it is unnecessary to form an additional device isolation layer. The p-type semiconductor layer 34 is formed of a polysilicon layer doped with p-type impurity ions or an amorphous silicon layer doped with p-type impurity ions.

Then, n-type impurity ions are implanted into the p-type semiconductor layer 34 of the photodiode region, thereby forming an n-type impurity region 35. P-type impurity ions are implanted into the n-type impurity region 35, thereby forming a p-type impurity region 39 in a surface of the n-type impurity region 35. Therefore, a photodiode is formed by the n-type impurity region 35 and the p-type impurity region 39.

Also, a gate insulating layer 36 and gate electrodes 37a, 37b and 37c are stacked on the p-type semiconductor layer 34 of the transistor region. N-type impurity ions are implanted into the p-type semiconductor layer 34 between each of the gate electrodes 37a, 37b and 37c, thereby forming source and drain regions 38 for each transistor. Thereafter, a first insulating interlayer 40 is formed on the surface of the transparent substrate including the gate electrodes 37a, 37b and 37c and the photodiode 35 and 39. Then, the first insulating interlayer 40 is selectively removed to expose the p-type impurity region 39 of the photodiode and the source and drain regions 38, thereby forming a contact hole.

Then, a first metal line 41 is formed on the first insulating interlayer 40. The first metal line 41 is electrically connected with the p-type impurity region 39 of the photodiode and the source and drain region 38 by the contact hole. Also, a plurality of insulating interlayers 42 and 43 are formed on the first insulating interlayer 40 including the first metal line 41, and a plurality of metal lines 44 are formed in the respective insulating interlayers.

In the CMOS image sensor according to the present invention, the light is received in the transparent substrate. Accordingly, a distance from a light-receiving part to the photodiode is short so that it is possible to improve the light-receiving efficiency. Also, it is unnecessary to form an additional microlens.

A method for manufacturing the CMOS image sensor according to an exemplary embodiment of the present invention will be described as follows.

Figure 7A:
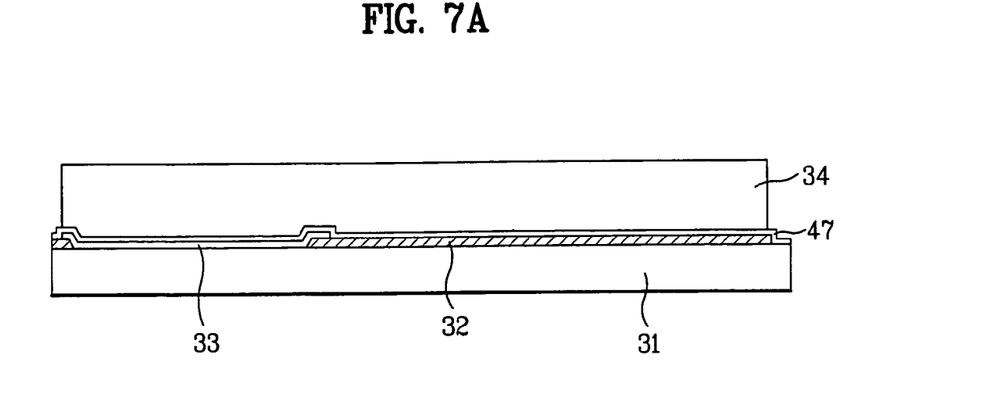
FIGS. 7A to 7D are cross sectional views a CMOS image sensor fabricated by a method according to the present invention.

FIGS. 7A to 7D are cross sectional views of a CMOS image sensor fabricated by a method according to an exemplary embodiment of the present invention. In the CMOS image sensor, as shown in FIG. 7A, an active area and a field area are defined, wherein the active area includes a photodiode region and a transistor region.

First, a light-shielding material is deposited on a transparent substrate, which may be a glass substrate or a quartz substrate, 31, and is then selectively removed to form a black matrix layer 32 on the field area and the active area excluding the photodiode region. The black matrix layer 32 may be formed of a metal material such as chrome Cr or a black resin to shield the light.

To realize a color image, an RGB color filter layer 33 is formed on the transparent substrate 31 of the photodiode region. That is, one unit cell comprises three photodiodes. First, a red color filter layer is formed on a surface of the transparent substrate 31, and then the red color filter layer is left in one of the three photodiodes by photolithography. Thereafter, a green color filter layer is formed on the surface of the transparent substrate 31, and then the green color filter layer is left in another of the three photodiodes by photolithography. After that, a blue color filter layer is formed on the surface of the transparent substrate 31, and then the blue color filter layer is left in the other of the three photodiodes by photolithography.

Then, an insulating layer 47, which may be made of silicon oxide or silicon nitride, is formed on the surface of the transparent substrate 31 including the RGB color filter layer 33 and the black matrix layer 32. Also, a p-type semiconductor substrate 34 is deposited on the insulating layer 47. Although not shown, after defining the active region by depositing a photoresist on the p-type semiconductor layer 34 and applying an exposure and development thereto, the p-type semiconductor layer 34 is selectively removed to be left only in the active region.

The p-type semiconductor layer 34 is formed of a polysilicon layer doped with p-type impurity ions or an amorphous silicon layer doped with p-type impurity ions. The p-type semiconductor layer 34 of the field region is removed, whereby it is unnecessary to form an additional device isolation layer or field insulating layer.

Figure 7B:
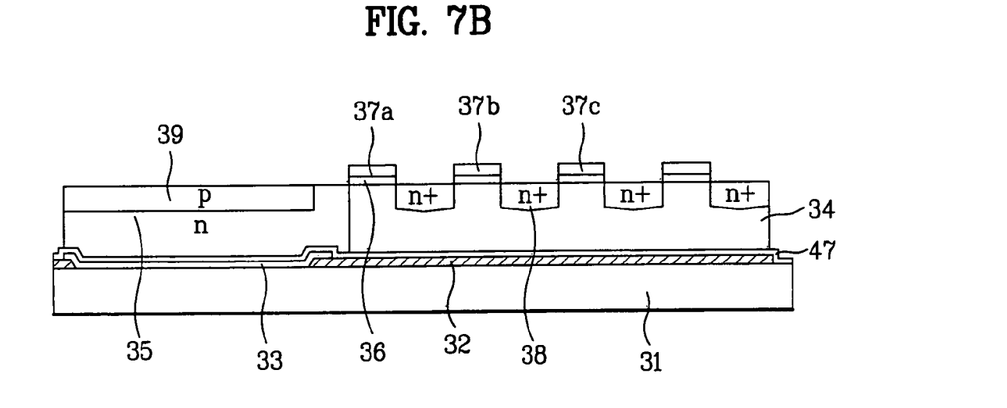

As shown in FIG. 7B, a gate insulating layer 36 and a conductive layer are deposited on the surface of the transparent substrate 31 including the p-type semiconductor layer 34, and are then selectively removed to form gate electrodes 37a, 37b and 37c of transistors. The gate electrodes of the transistors correspond to the gate electrode 37a of the reset transistor Rx, the gate electrode 37b of the driver transistor Dx and the gate electrode 37c of the select transistor Sx. When fabricating 4T-type and 5T-type CMOS image sensors, additional gate electrodes are required.

Then, n-type impurity ions are implanted into the p-type semiconductor layer 34 of the photodiode region, thereby forming an n-type impurity region 35 of a photodiode. P-type impurity ions are implanted into the n-type impurity region 35, thereby forming a p-type impurity region 39 in a surface of the n-type impurity region 35. Therefore, the photodiode is formed by the n-type impurity region 35 and the p-type impurity region 39.

Also, n-type impurity ions are implanted into the p-type semiconductor layer 34 between each of the gate electrodes 37a, 37b and 37c, thereby forming source and drain regions 38.

Figure 7C:
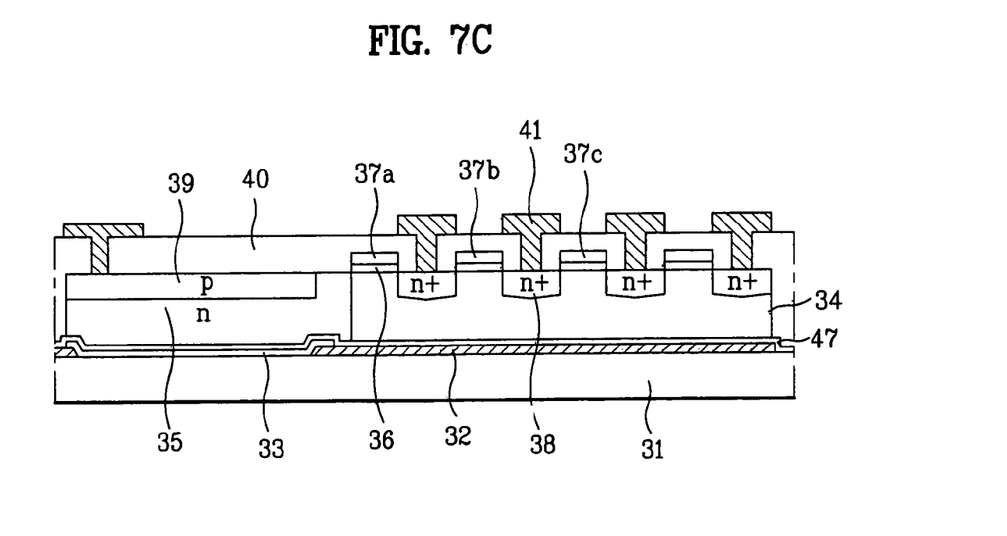

Referring to FIG. 7C, a first insulating interlayer 40 is formed on the surface of the transparent substrate 31 including the gate electrodes 37a, 37b and 37c and the photodiode. Then, the first insulating interlayer 40 is selectively removed to expose the p-type impurity region 39 of the photodiode and the source and drain regions 38, thereby forming a contact hole 46.

Thereafter, a metal layer is deposited on the surface of the transparent substrate 31, and is then selectively removed to form a first metal line 41 on the first insulating interlayer 40. The first metal line 41 is electrically connected with the p-type impurity region 39 of the photodiode and the source and drain regions 38 by the contact hole 46.

Figure 7D:
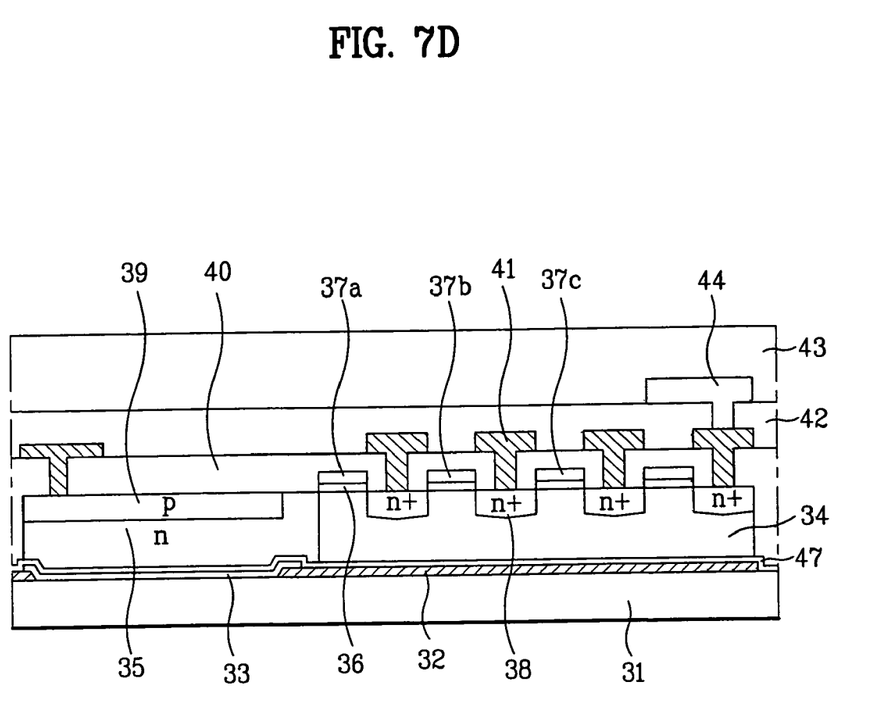

As shown in FIG. 7D, a second insulating interlayer 42 is deposited on the first insulating interlayer 40 including the first metal line 41. Then, another contact hole is formed in the first metal line 41, and a second metal line 44 is formed on the second insulating interlayer 42. The second metal line 44 is electrically connected with the first metal line 41 by the contact hole.

It is possible to form a plurality of metal lines, by repetitively forming a third insulating interlayer 43, a metal layer and a plurality of insulating layers on the surface of the transparent substrate 31 including the second metal line 44. The RGB color filter layer 33 and/or the black matrix layer 32 may be formed on a rear surface of the transparent substrate 31.

Figure 8:
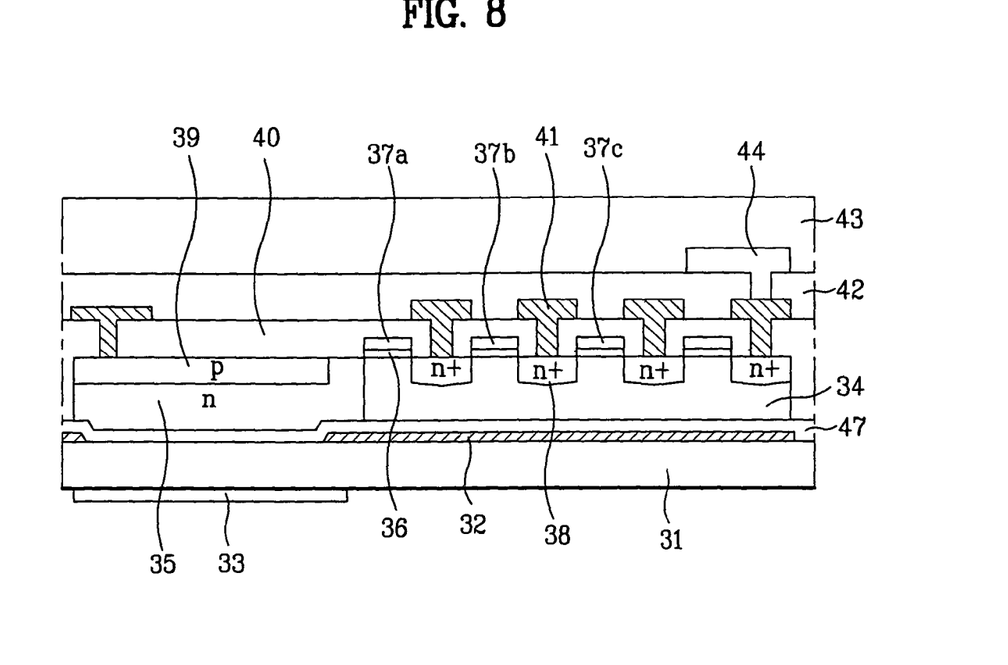
FIG. 8 is a cross sectional view of a CMOS image sensor according to another exemplary embodiment of the present invention.

FIG. 8 is a cross sectional view of a CMOS image sensor according to another exemplary embodiment of the present invention.

In the CMOS image sensor of this exemplary embodiment, the RGB color filter layer 33 is formed on a rear surface of the transparent substrate 31 corresponding to the photodiode region. Otherwise, the CMOS image sensor according to this embodiment of the present invention is the same in structure as the CMOS image sensor according to the previous embodiment of the present invention.

When manufacturing the CMOS image sensor according to this exemplary embodiment of the present invention, the RGB color filter layer 33 is formed on a rear surface of the transparent substrate 31 corresponding to the photodiode region after finishing all the processing described with reference to FIGS. 7A to 7D.

Figure 9:
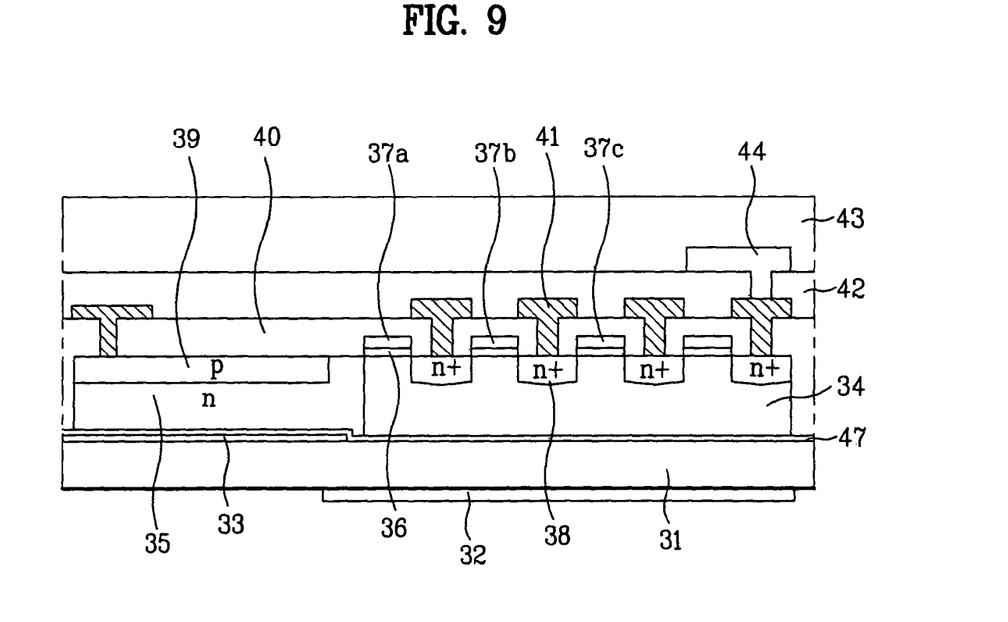
FIG. 9 is a cross sectional view of a CMOS image sensor according to another exemplary embodiment of the present invention.

FIG. 9 is a cross sectional view of a CMOS image sensor according to another exemplary embodiment of the present invention.

In the CMOS image sensor of this exemplary embodiment, the black matrix layer 32 is formed on a rear surface of the transparent substrate 31 corresponding to the remaining portions excluding the photodiode region. Otherwise, the CMOS image sensor according to this embodiment of the present invention is the same in structure as the CMOS image sensor according to the previous embodiment of the present invention.

When manufacturing the CMOS image sensor according to this exemplary embodiment of the present invention, the black matrix layer 32 is formed on a rear surface of the transparent substrate 31 corresponding to the remaining portions excluding the photodiode region after finishing all the processing described with reference to FIGS. 7A to 7D.

Figure 10:
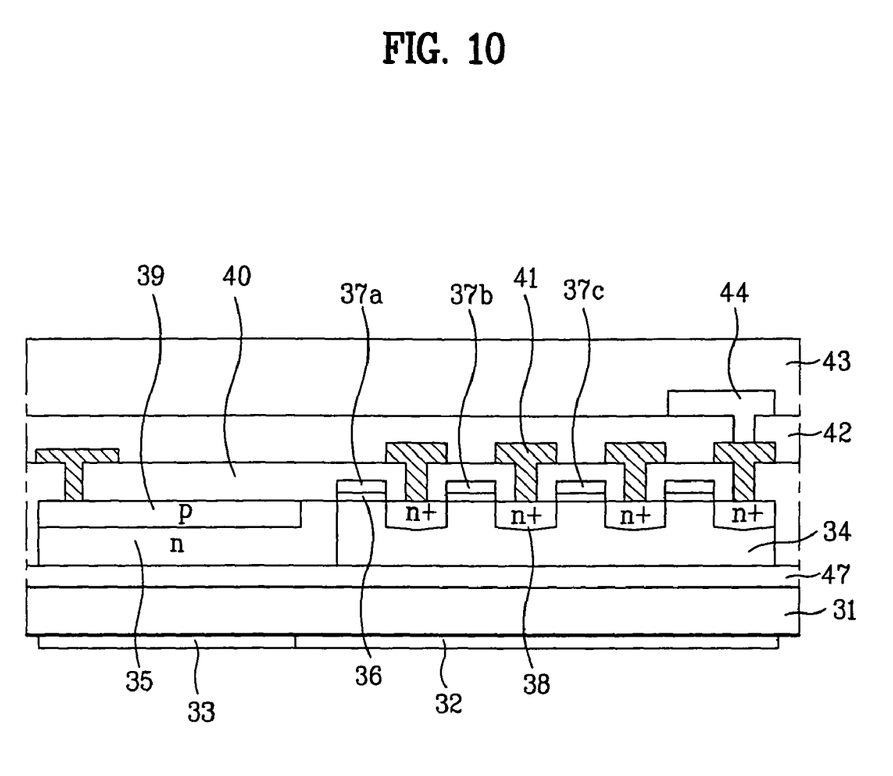
FIG. 10 is a cross sectional view of a CMOS image sensor according to another exemplary embodiment of the present invention.

FIG. 10 is a cross sectional view of a CMOS image sensor according to another exemplary embodiment of the present invention.

In the CMOS image sensor of this exemplary embodiment, the RGB color filter layer 33 and the black matrix layer 32 are formed on a rear surface of the transparent substrate 31. That is, the RGB color filter layer 33 is formed on the rear surface of the transparent substrate 31 corresponding to the photodiode region, and the black matrix layer 32 is formed on the rear surface of the transparent substrate 31 corresponding to the remaining portions excluding the photodiode region. Otherwise, the CMOS image sensor according to this embodiment of the present invention is the same in structure as the CMOS image sensor according to the previous embodiment of the present invention.

When manufacturing the CMOS image sensor according to this exemplary embodiment of the present invention, the RGB color filter layer 33 and the black matrix layer 32 are formed on the rear surface of the transparent substrate 31 after finishing all the processing described with reference to FIGS. 7A to 7D.

As mentioned above, the CMOS image sensor and the method for manufacturing the same according to the present invention have the following advantages.

First, the photodiode is formed on the transparent substrate, and the light is received in the transparent substrate. Accordingly, as the distance from the light-receiving surface to the photodiode is shorter, it is possible to improve the light-receiving efficiency of the photodiode.

Also, it is unnecessary to form the additional micro-lens.

Furthermore, the formation of the photodiode does not depend on the metal line so that the light-receiving area of the photodiode increases.

Also, the metal line may be formed over the photodiode. In this respect, the design of the metal line is not restricted.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A CMOS image sensor comprising:
   a transparent substrate including an active area, having a photodiode region and a transistor region, the transparent substrate further including a field area for isolation of the active area;
   a black matrix layer on a rear surface of the transparent substrate corresponding to the field area and the active area excluding the photodiode region;
   a color filter layer formed on a rear surface of the photodiode region;
   a p-type semiconductor layer only on the active area but not on the field area of the transparent substrate on which the black matrix layer is formed;
   a photodiode in the p-type semiconductor layer corresponding to the photodiode region; and
   a plurality of transistors in the p-type semiconductor layer corresponding to the transistor region.

2. The CMOS image sensor of claim 1, further comprising an insulating layer between the p-type semiconductor layer and the transparent substrate including the black matrix layer and the color filter layer.

3. The CMOS image sensor of claim 1, wherein the transparent substrate is formed of a glass substrate or a quartz substrate.

4. The CMOS image sensor of claim 1, wherein the black matrix layer is formed of a metal material or a black resin to shield light.

5. The CMOS image sensor of claim 1, wherein the p-type semiconductor layer is formed in the active area.

6. The CMOS image sensor of claim 1, wherein the p-type semiconductor layer is formed of a polysilicon layer doped with p-type impurity ions or an amorphous silicon layer doped with p-type impurity ions.

7. The CMOS image sensor of claim 1, wherein the photodiode includes:
   an n-type impurity region formed by implanting n-type impurity ions into the p-type semiconductor layer; and
   a p-type impurity region formed in the surface of the n-type impurity region.

8. The CMOS image sensor of claim 1, wherein the plurality of transistors include:
   a plurality of gate electrodes formed with a gate insulating layer on the p-type semiconductor layer corresponding to the transistor region; and
   a source region and a drain region on the p-type semiconductor layer between each of the plurality of gate electrodes.

9. The CMOS image sensor of claim 1, further comprising:
   an insulating interlayer on a surface of the transparent substrate including the plurality of transistors and the photodiode; and
   a metal line on the insulating interlayer.

10. A CMOS image sensor comprising:
    a transparent substrate including an active area having a photodiode and a transistor regions the transparent substrate further including a field area for isolation of the active area;
    a black matrix layer on the transparent substrate corresponding to the field area and the active area excluding the photodiode region;
    a color filter layer formed on the same surface as the black matrix layer of the photodiode region;
    a p-type semiconductor layer only on the active area but not on the field area of the transparent substrate on which the black matrix layer is formed;
    a photodiode in the p-type semiconductor layer corresponding to the photodiode region; and
    a plurality of transistors in the p-type semiconductor layer corresponding to the transistor region.

11. A CMOS image sensor comprising:
    a transparent substrate including an active area having a photodiode and a transistor regions the transparent substrate further including a field area for isolation of the active area;
    a color filter layer on a rear surface of the transparent substrate corresponding to the photodiode region;
    a black matrix layer on the transparent substrate corresponding to the field area and the active area excluding the photodiode region;
    a p-type semiconductor layer only on the active area but not on the field area of the transparent substrate on which the black matrix layer is formed;
    a photodiode in the p-type semiconductor layer corresponding to the photodiode region; and
    a plurality of transistors in the p-type semiconductor layer corresponding to the transistor region.

* * * * *